United States Patent
Makuth et al.

(10) Patent No.: US 9,121,878 B2
(45) Date of Patent: Sep. 1, 2015

(54) METHOD FOR CONTACTLESS DETERMINATION OF ELECTRICAL POTENTIAL USING OSCILLATING ELECTRODE, AND DEVICE

(75) Inventors: Jens Makuth, Feucht (DE); Dirk Scheibner, Nuremberg (DE); Jürgen Schimmer, Nuremberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 137 days.

(21) Appl. No.: 14/111,712

(22) PCT Filed: Apr. 14, 2011

(86) PCT No.: PCT/EP2011/055957
§ 371 (c)(1),
(2), (4) Date: Oct. 14, 2013

(87) PCT Pub. No.: WO2012/139651
PCT Pub. Date: Oct. 18, 2012

(65) Prior Publication Data
US 2014/0035598 A1    Feb. 6, 2014

(51) Int. Cl.
G01R 29/12    (2006.01)
G01R 27/26    (2006.01)

(52) U.S. Cl.
CPC ............ *G01R 27/2605* (2013.01); *G01R 29/12* (2013.01)

(58) Field of Classification Search
CPC .......................... G01R 27/2605; G01R 29/12
USPC ......................................... 324/658, 457, 458
See application file for complete search history.

(56) References Cited

U.S. PATENT DOCUMENTS

| | | | |
|---|---|---|---|
| 4,205,267 A * | 5/1980 | Williams | ..................... 324/458 |
| 5,473,244 A | 12/1995 | Libove et al. | |
| 6,573,725 B2 | 6/2003 | Kieres et al. | |
| 2003/0038638 A1 | 2/2003 | Kieres et al. | |
| 2006/0186898 A1 | 8/2006 | Ichimura et al. | |
| 2007/0065169 A1 | 3/2007 | Kandori et al. | |

(Continued)

FOREIGN PATENT DOCUMENTS

| | | |
|---|---|---|
| CN | 1575419 | 2/2005 |
| GB | 2 443 280 A | 4/2008 |

(Continued)

OTHER PUBLICATIONS

International Search Report for PCT/EP2011/055957 mailed Dec. 28, 2011.

*Primary Examiner* — Benjamin M Baldridge
*Assistant Examiner* — Farhana Hoque
(74) *Attorney, Agent, or Firm* — Staas & Halsey LLP

(57) ABSTRACT

The electrical potential of an object is determined by providing a mechanically oscillating electrode located at a distance from the object and making the electrode mechanically oscillate. A change in a state of electric charge of the electrode over time and amplitudes of at least two frequency components during the change in the state of electric charge over time are determined. Based on the amplitudes, at least one parameter that forms part of the value of a capacitance of an arrangement formed by the electrode and the object is determined, so that the capacitance of the arrangement formed by the electrode and object can be determined based on the parameter. Finally, the electrical potential is determined from the change in the state of electric charge and the capacitance.

8 Claims, 6 Drawing Sheets

(56) References Cited

U.S. PATENT DOCUMENTS

2007/0247166 A1    10/2007    Ichimura et al.
2010/0019779 A1    1/2010    Kato et al.

FOREIGN PATENT DOCUMENTS

| | | |
|---|---|---|
| JP | 8-271562 | 10/1996 |
| JP | 2008-185429 | 8/2008 |

* cited by examiner

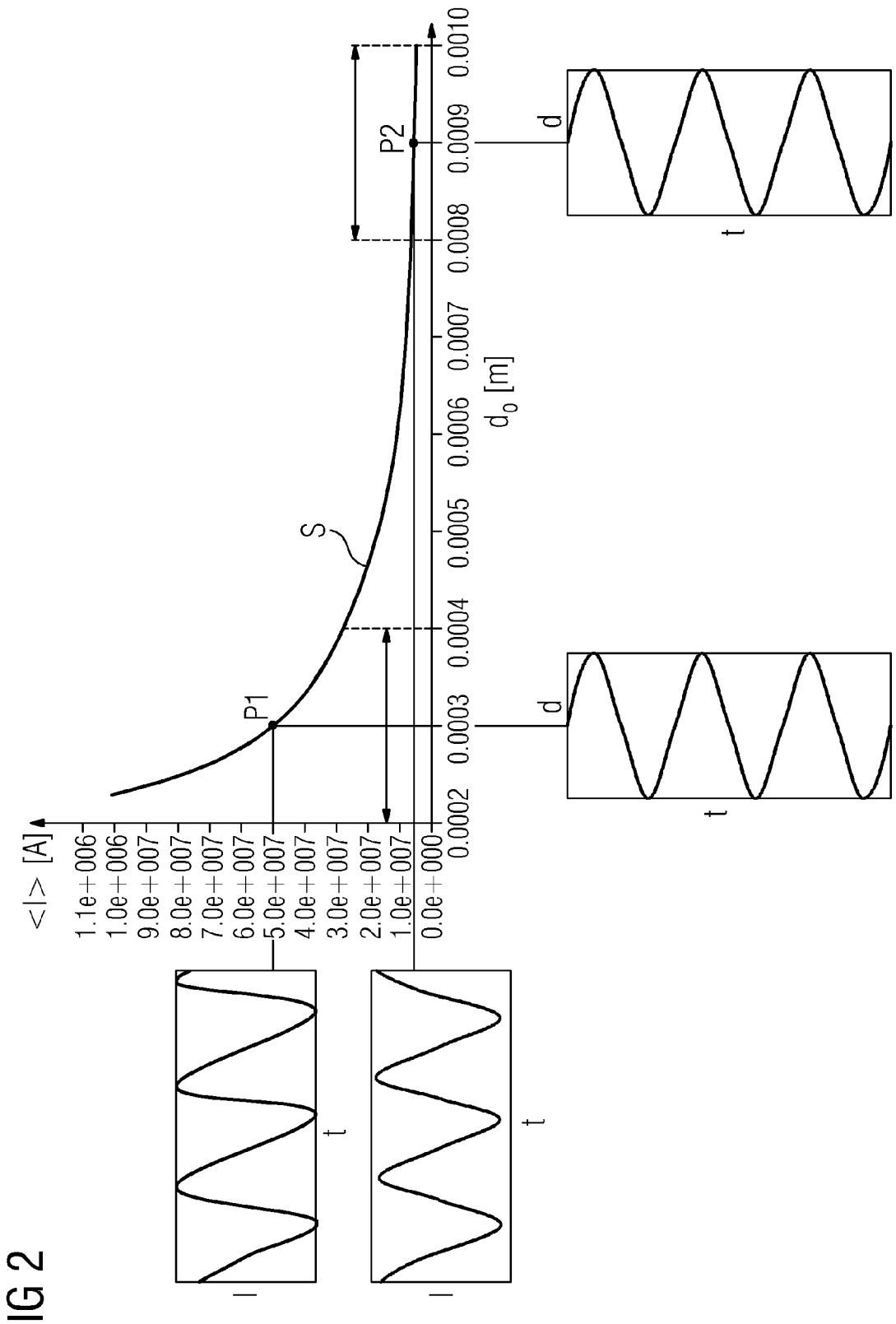

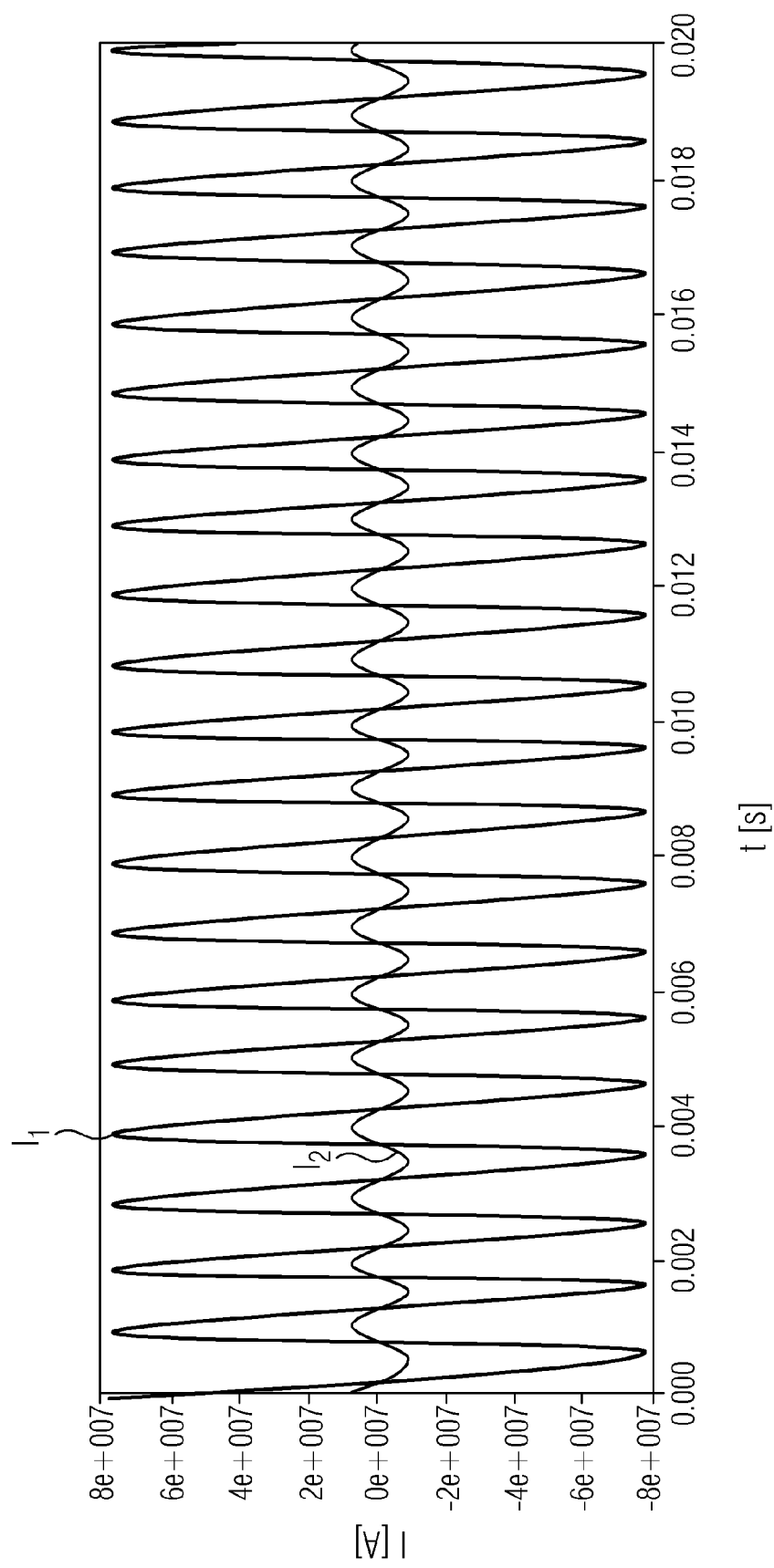

METHOD FOR CONTACTLESS DETERMINATION OF ELECTRICAL POTENTIAL USING OSCILLATING ELECTRODE, AND DEVICE

CROSS REFERENCE TO RELATED APPLICATIONS

This application is the U.S. national stage of International Application No. PCT/EP2011/055957, filed Apr. 14, 2011 and claims the benefit thereof and is incorporated by reference herein in its entirety.

BACKGROUND

Described below are a method and an apparatus for the contactless determination of an electrical potential of an object.

It is known to measure the current flow through an object in a contactless manner. This can take place by way of inductive coupling, the Hall effect or the GMR (Giant Magneto Resistance) effect. In order to be able to measure contactless electrical output, aside from the contactless current measurement, a method for the contactless potential measurement is also required. The contactless potential measurement, in particular of high voltages, is inter alia particularly important in the field of smart metering, smart grid and response demand strategies.

So-called electric field meters provide one possibility. These use the effect of influence in order to be able to conclude the voltage to be determined by way of the determined electrical field strength. The distance between the object, the potential of which is to be determined, and the measuring electrode of the electric field meter and the material (dielectric layer) between the measuring electrode and object must however be made known precisely in the measuring capacitance. In order also to be able to measure direct voltages using an electric field meter, a shutter (field diaphragm) in the form of a chopper (impeller) is generally used between the measuring electrode and the object.

Capacitive voltage dividers can also be used to determine pure alternating voltages, wherein the coupling capacitance between a reference electrode and the potential to be measured must likewise be made known here.

Both methods and/or apparatuses (electric field meters and capacitive voltage dividers) presuppose precise knowledge of the coupling to the voltage to be measured, in particular the distance between measuring electrode and measuring object. In this respect, these known methods are unsuited to only temporary measuring processes or subsequent measuring installations. Electric field meters and capacitive voltage dividers are permanently installed for precise measurements and are calibrated in the installation surroundings. With manual measuring devices, precise knowledge of the geometry and material properties (line insulation, air, gas, condensation, etc.) of the measuring structure is required. To this end, special spacers are used with known electric field meters for instance. Spacers are nevertheless disadvantageous in that they do not rest directly on the conductive material, particularly for the potential determination of electrical insulated lines, and thus adjust the distance only to an inadequately precise degree. In addition, the type of insulating material cannot be taken into account. If this precision of the known contactless potential measuring methods is insufficient, it must be measured conventionally using contact.

SUMMARY

Described below are a method and an apparatus, with which a contactless potential measurement is possible even with an initially unknown coupling capacitance.

The method is used for the contactless determination of an electrical potential of an object and includes the following:
a) providing a mechanically oscillating electrode, which is arranged spatially distanced from the object;
b) triggering the electrode to oscillate mechanically;
c) determining a temporal change in an electrical charge state of the electrode;
d) determining amplitudes of at least two frequency components in the temporary change of the electrical charge state;
e) determining at least one parameter which is included in the value of an electrical capacitance of the electrode and object, by the determined amplitudes;
f) determining the electrical capacitance of the electrode and object with the aid of the determined parameter;
g) determining the electrical potential from the determined change in the electrical charge state and the determined capacitance.

Within the scope of the method, the coupling capacitance between the electrode and the object can therefore be determined immediately, so that no prior knowledge or fine tuning of this capacitance is in particular required for the potential measurement. The actual potential measurement thus virtually presupposes calibration within the scope of the method, by which unknown parameters can be determined, which are required in order to determine the coupling capacitance. Contrary to the use of electric field meters or capacitative voltage dividers, with the use of the described method no knowledge of the distance of the electrode from the object or no knowledge of the dielectric constant of the material between the electrode and the object is required during a contactless potential measurement. A precise mechanical adjustment or a defined permanent installation of a measuring device is omitted. Within the scope of the method, the capacitance can be determined precisely. Very precise contactless measurements of the unknown potential are thus possible.

The method includes the following:
d1) determining a first amplitude at a first frequency;
d2) determining a second amplitude at a second frequency, the value of which is a whole number multiple of the value of the first frequency; and
e1) determining an idling distance of the electrode from the object from the ratio of the first to the second amplitude.

The frequency can be any frequency in particular which characterizes the temporal change in the electrical charge state of the electrode. It is desirable to determine the second amplitude at a second frequency, the value of which is twice as large as the value of the first frequency. As an alternative to determining the idling distance, a more effective idling distance value which is weighted with a dielectric constant can also be determined from the ratio of the first to the second amplitude. It is desirable for the temporal change in the electrical charge state to be determined by way of a predetermined time interval and for a Fourier analysis to be implemented at the thus specified course. The amplitudes dependent on the frequency components can then result from the Fourier analysis, so that a first amplitude at a basic frequency and the second amplitude at an upper frequency corresponding hereto can be determined and therefrom the ratio can be determined. This type of measurement is comparatively simple and allows precise conclusions to be drawn as to the idling distance of the electrode from the object. A direct distance measurement, for instance by way of a mechanical spacers, is not required. The calibration process overall is simple and uncomplicated. A direct contacting of the object, the potential of which is to be determined, is not required within the scope of the method. The potential can thus also be determined by objects which are difficult to access.

The determination of the at least one parameter by way of a mathematical association and/or a calibration curve takes place in (e). A calibrating measurement is only required then, by way of which the calibration curve or the mathematical association is determined, and the at least one parameter can be clearly assigned to the amplitude values.

The electrode is thus mechanically oscillated in (b) such that its oscillation direction proceeds in parallel to an electrical field line, which is caused by the electrical potential of the object. A very defined physical situation is then produced and the determination of the coupling capacitance between the object and electrode can take place very easily. Very precise measurements are possible.

The determination of the temporal change in the electrical charge state of the electrodes takes place in (c) by measuring a changeover current. A reference potential carrier can herewith be electrically connected to the electrode and a current measuring device can be arranged between the electrode and the reference potential carrier. An arrangement using an amplifier, by which the voltage dropping at the electrode is compared with a predeterminable reference voltage, may be used. Current measurements can be implemented very precisely and accordingly allow for very precise conclusions to be drawn as regards the electrical potential to be determined. An effective changeover current can be determined for the determination of the electrical potential.

The electrical potential may be determined in (g) by way of a mathematical association and/or a calibration curve from the determined change in the electrical charge state.

The method allows for the determination of a temporally constant potential on the object. A temporally changeable change in charge state which is able to be measured is already produced on the electrode by oscillation of the electrode. An electrical potential of the object can also be determined by the method, the electrical potential being temporally changeable and being characterizable by an electrical oscillation frequency. The electrode in (b) is in this way mechanically oscillated such that the associated mechanical oscillation frequency is greater than the electrical oscillation frequency. A very high ratio of the mechanical oscillation frequency in respect of the electrical oscillation frequency may be used. The electrode then provides almost a temporary constant potential on the object and a decoupled observation can be implemented. A shutter or impeller is then required neither for AC nor for DC measurements.

An apparatus used for the contactless determination of an electrical potential of an object includes:
  a mechanically oscillating electrode, which can be arranged spatially distanced from the object;
  a measuring apparatus, which is embodied to determine a temporal change in an electrical charge state of the electrode; and
  an evaluation apparatus, which is embodied to determine amplitudes of at least two frequency components in the temporal change in the electrical charge state, to determine at least one parameter, which is included in the value of an electrical capacitance of the electrode and object, by the determined amplitude, to determine the electrical capacitance of the electrode and object with the aid of the determined parameter, and to determine the electrical potential from the determined change in the electrical charge state and the determined capacitance.

The electrode may be embodied as an electrically conductive plate, which is essentially oscillatable in the direction of the plate normal, wherein the plate may be electrically connected to the measuring apparatus, which is embodied as a current measuring device.

The embodiments of the method and their advantages apply accordingly to the apparatus.

BRIEF DESCRIPTION OF THE DRAWINGS

These and other aspects and advantages will become more apparent and more readily appreciated from the following description of the exemplary embodiments, taken in conjunction with the accompanying drawings of which;

FIG. 2 is a graph illustrating the dependency of an effective changeover current on the idling distance of the measuring electrode of the conductor;

FIG. 3A is a graph illustrating the dependency of a changeover current on the time for two different distances of the measuring electrode of the line;

DETAILED DESCRIPTION OF THE PREFERRED EMBODIMENT

Figure 1:
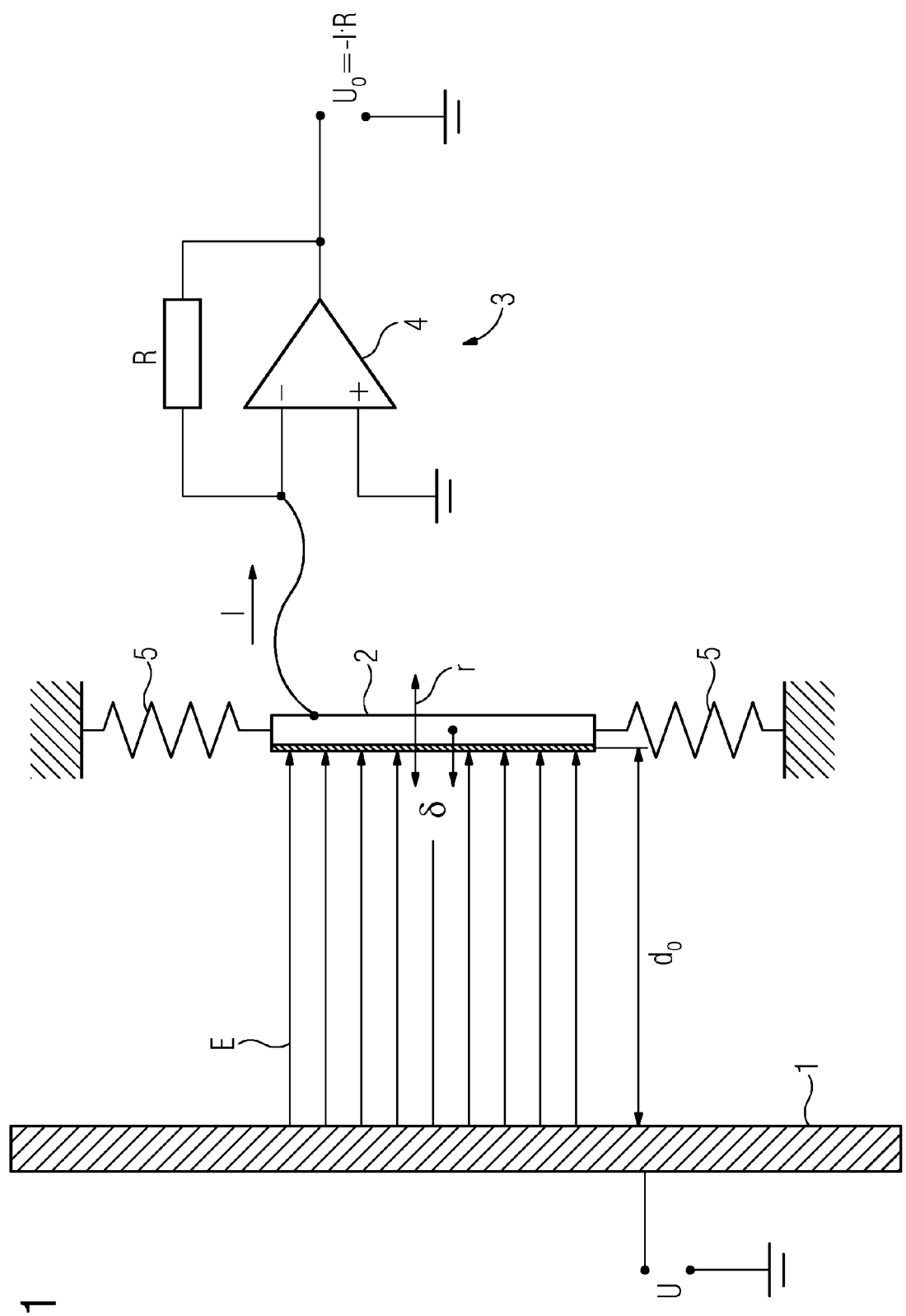
FIG. 1 is a schematic representation in cross section and circuit diagram of an apparatus for measuring an unknown potential of a line.

Identical or functionally identical elements are provided with the same reference characters in the figures.

FIG. 1 shows a line 1, which represents an object, the electrical potential or voltage U of which is to be determined. A measuring electrode 2, which is able to oscillated, is arranged in the idling distance $d_0$. The ability to oscillate is here, only shown schematically, enabled by way of two springs 5. This arrangement allows for mechanical oscillation of the measuring electrode 2 in the oscillation direction r and thus in a direction which runs in parallel to the surface normal of the measuring electrode 2. The measuring electrode 2 is embodied from a metal, so that on account of the influence in the electrical field E of the line 1, a change in the charge state of the measuring electrode 2 results. This changeover can be detected by way of measuring a changeover current I. The changeover current I is herewith detected by a measuring apparatus 3, which represents a reference potential carrier.

The measuring apparatus 3 includes an amplifier 4 with a first input, which is electrically connected to the measuring electrode 2, and a second input, which is earthed. An output of the amplifier 4 is electrically connected to the first input by way of an electrical resistance R.

Within the scope of the measuring method, the measuring electrode 2 is mechanically oscillated in the oscillation direction r with the frequency f. The following physical associations result:

A plate condenser arrangement with a coupling capacitance C is produced by the line 1 and the measuring electrode 2. The capacitance C is calculated according to $$C = \frac{\varepsilon \cdot A}{d}$$

∈ is herewith the dielectric constant of the medium filling the condenser arrangement;

A is the surface of the measuring electrode 2; and d is the time-dependent distance between the measuring electrode 2 and the line 1.

With the circular frequency $$\omega = 2\pi f,$$

the following results for the capacitance C $$C(t) = \frac{\varepsilon \cdot A}{d(t)} = \frac{\varepsilon \cdot A}{d_0 + \delta \cdot \sin(\omega t)}$$

The respectively flowing changeover current I subsequently amounts to:

$$I = U \cdot dC/dt =$$

$$U \cdot \varepsilon \cdot A \cdot \frac{-\delta \cdot \cos\omega t}{(d_0 + \delta \cdot \sin\omega t)^2} = U \cdot \varepsilon \cdot A \cdot \frac{-\delta \cdot \cos\omega t}{d_0 + 2d_0\delta \cdot \sin\omega t + \frac{1}{2} - \frac{\cos 2\omega t}{2}}$$

The modulation of the measuring capacitance C between measuring electrode 2 and line 1 results in the changeover current I, which is used in two respects within the scope of an evaluation. On the one hand, it is used within the scope of calibration to determine the unknown capacitance C; on the other hand, its effective value is used in order to determine the unknown voltage U by the capacitance determined in the calibration. This is explained in more detail below.

FIG. 2 shows a diagram with a curve S. This represents the association between the effective changeover current <I> and the idling distance $d_0$. Two points P1 and P2 are plotted by way of example on the curve S. The idling distance amounts to $d_0$=0.3 mm at point P1, while it amounts to $d_0$=0.9 mm at point P2. The effective changeover current <I> is accordingly larger at point P1 than at point P2.

For points P1 and P2, the time-dependent current and distance courses are then also shown in each instance in FIG. 2. As can be inferred from a comparison of the current courses in points P1 and P2, the curve associated with the time-dependent changeover current I is more significantly distorted at point P1 than at point P2. With an ever reducing basic distance or idling distance $d_0$, the signal shape of the changeover current I is increasingly distorted. This effect can be used to determine the idling distance $d_0$.

Figure 3B:
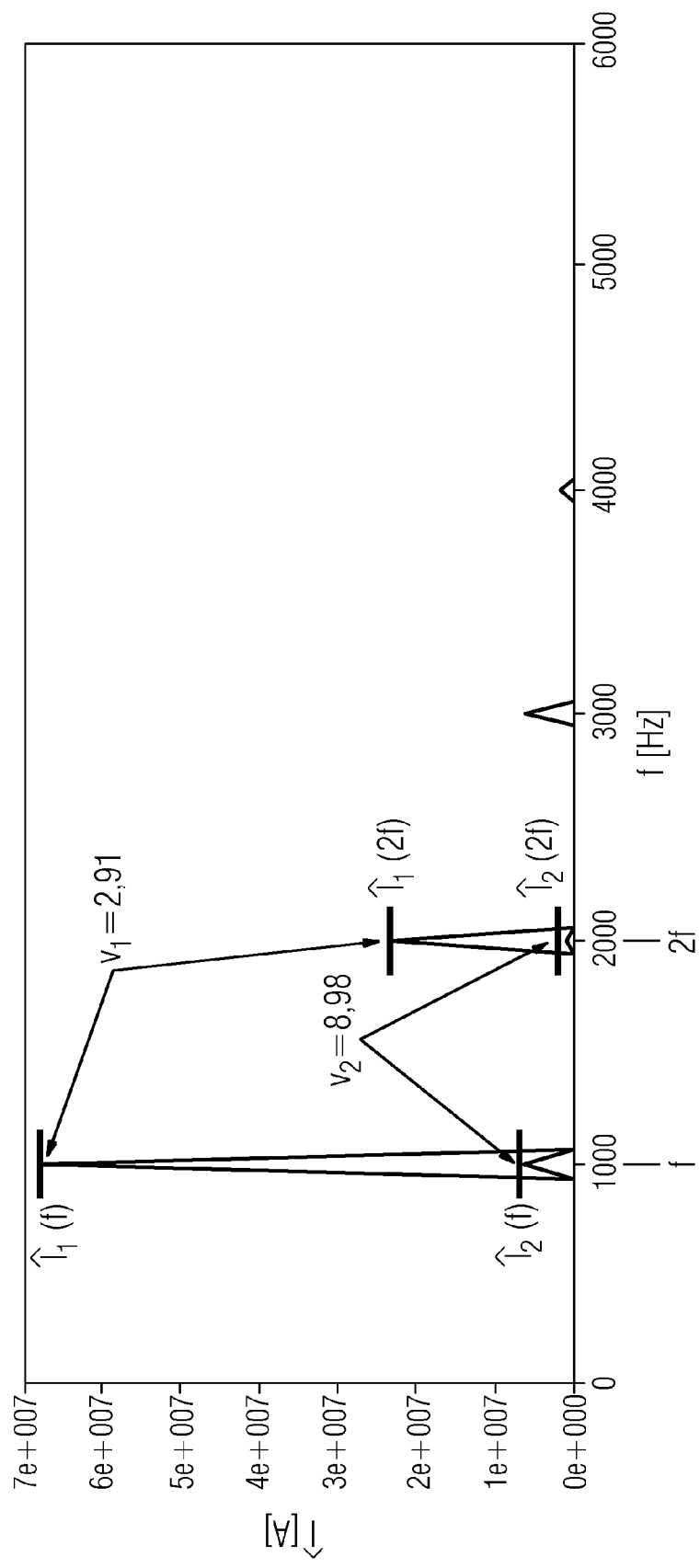
FIG. 3B is a graph of an amplitude spectrum obtained from the curves of FIG. 3A by way of Fourier transformation.

The time behavior of the changeover currents is assembled once again in FIG. 3A. The changeover current dependent on the time t at point P1 is referred to with $I_1$, whereas the changeover current at point P2 is referred to with $I_2$. A Fast Fourier transformation (FFT) is now implemented at the changeover current courses $I_1$ and $I_2$. The amplitude spectrum shown in FIG. 3B herewith results for the changeover current. The frequency f is shown in Hertz on the x-axis, whereas the amplitude of the changeover current I is shown in amperes on the y-axis. The changeover current $I_1$ has a number of frequency components. The amplitude at the basic frequency f=1000 Hz is referred to with $\hat{I}_1(f)$; whereby the first upper frequency 2f=2000 Hz amounts to the amplitude $\hat{I}_1(2f)$. The ratio of these two amplitudes is calculated according to $$v_1 = \frac{\hat{I}_1(f)}{\hat{I}_1(2f)}$$

an amounts to $v_1$=2.91.

The same can apply to the changeover current $I_2$ in FIG. 3A. A Fourier analysis can also be implemented on its time-dependent course, so that an amplitude spectrum shown similarly in FIG. 3B results with the amplitude $\hat{I}_2(f)$ and $\hat{I}_2(2f)$. The amplitude ratio is also calculated here according to $$v_2 = \frac{\hat{I}_2(f)}{\hat{I}_2(2f)}$$

so that the value $v_2$=8.98 arises. If the spectra shown in FIG. 3B are considered for the two idling distances 0.3 mm and 0.9 mm, it is clear that the upper thresholds with an increasing idling distance $d_0$ become less. The ratio of basic to first upper wave increases accordingly.

Figure 4:
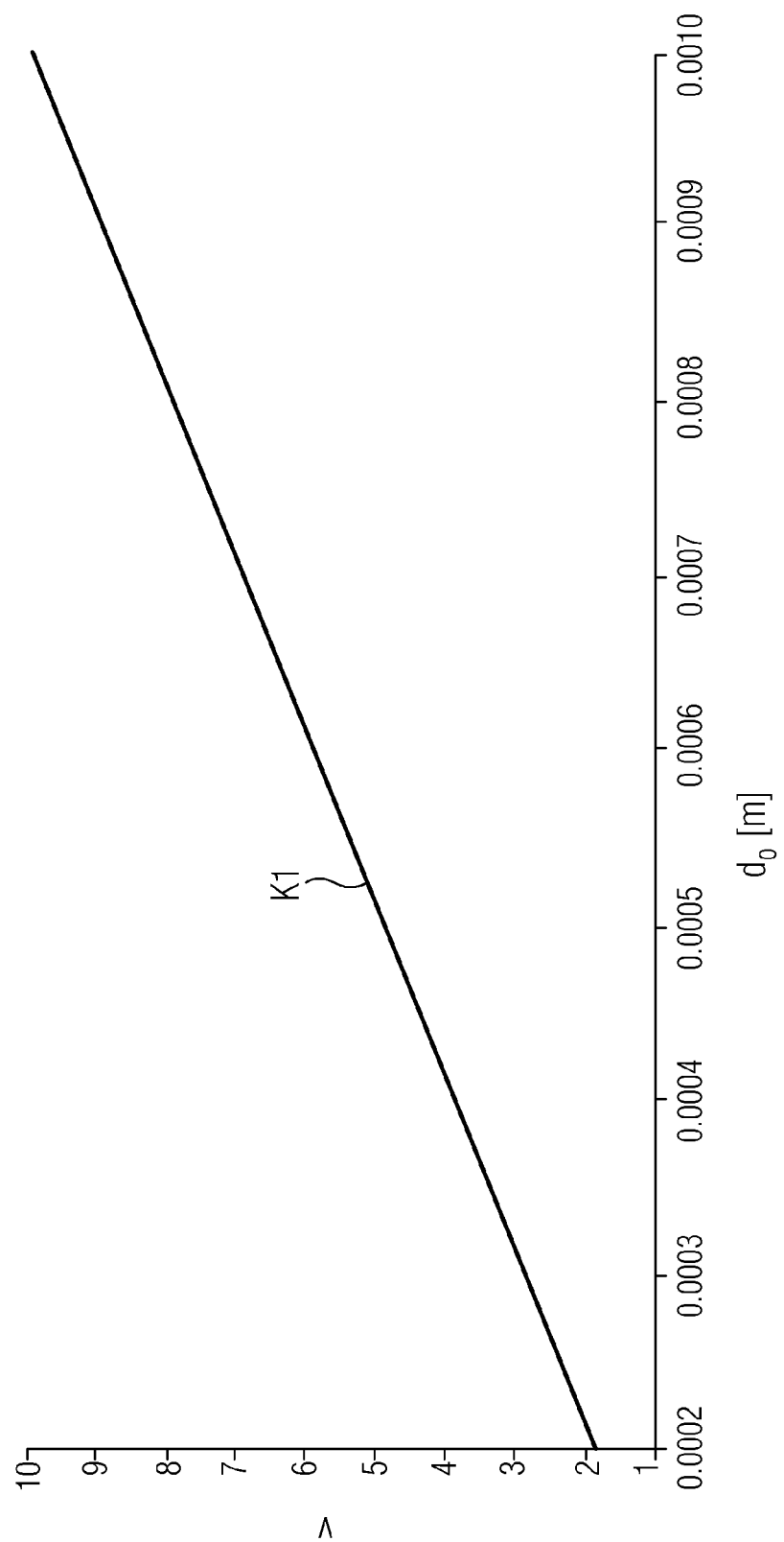
FIG. 4 is a graph of a calibration curve, which assigns an idling distance to each amplitude ratio of the amplitude spectrum of FIG. 3B.

An idling distance $d_0$ can now be unambiguously assigned to this ratio v by way of a calibration curve. This is shown in FIG. 4 for a calibration curve K1. A linear association exists between the ratio v and the idling distance $d_0$. A recourse from v to $d_0$ is thus possible. This ratio is also independent of the unknown potential. The evaluation of this ratio is used for calibration purposes within the scope of the measuring method. If necessary, instead of the idling distance $d_0$ on the x-axis, a distance weighted with the dielectric constant E, e.g. a distance in form $d_0/\in$ can be plotted. With the determination of the idling distance $d_0$, it is now possible with the known dielectric constant ∈ and known surface A to conclude the capacitance C. A determination of the voltage U is thus in principle possible from the measured changeover current I. The calibration within the scope of the method is thus terminated.

Figure 5:
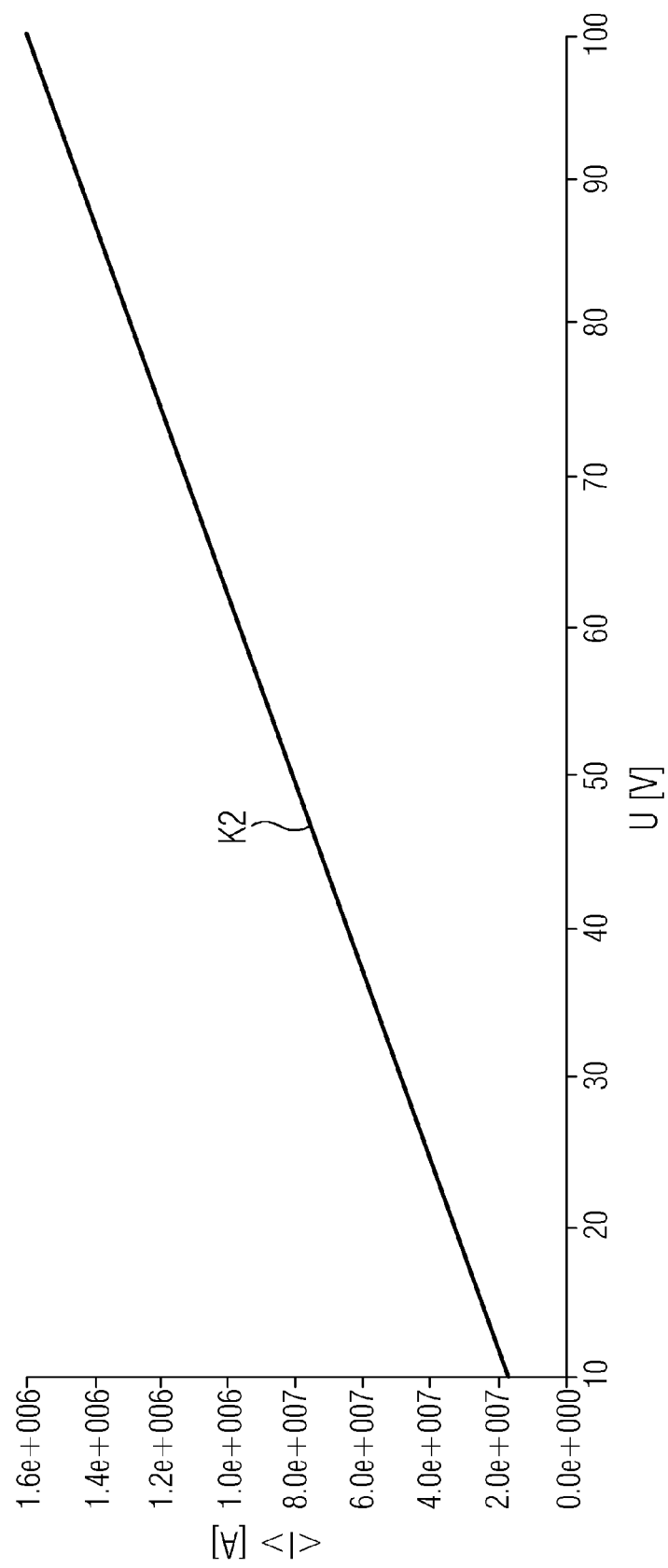
FIG. 5 is a graph of a calibration curve, which assigns a voltage value of the line to each effective current value.

During actual measuring operation, the effective value <I> of the changeover current I is then formed for instance. Since a linear association of the effective changeover current <I> exists at the unknown potential U, the unknown potential U can be concluded directly by way of a calibration curve K2. This association is shown in FIG. 5.

In the exemplary embodiment in FIGS. 2 to 5, the following assumptions were made: frequency f=1 kHz; oscillation amplitude δ=100 μm; and surface A=100 mm².

The two substeps of the measuring method are combined again:

1. The measuring electrode 2 is positioned upstream of the line in a calibration. After, the idling distance $d_0$ is not known exactly to the installation; a calibration is required. The measuring electrode 2 is oscillated and the changeover current I is evaluated spectrally in the oscillating measuring electrode 2. The amplitudes $\hat{I}_2(f)$ and $\hat{I}_2(2f)$, on the oscillating frequency f on the first harmonic wave 2f are observed. The ratio v of the amplitude $\hat{I}(f)$ of the basic frequency to the amplitude $\hat{I}(2f)$ of the first harmonic wave is directly proportional here to the idling distance and and independent of the unknown voltage U. The method thus enables determination of the basic distance or idling distance $d^0$.

2. During measuring, the effective value <I> of the changeover current I is formed on the oscillating measuring electrode 2. A proportional association exists between the changeover current <I> on the measuring electrode 2 and the unknown potential U. The associated proportionality factor (typically the capacitance C) is determined in advance during calibration 1.

The method subsequently allows for a contactless measurement of unknown potentials with an oscillating electrode, which moves transversally with respect to the unknown potential. The oscillating frequency is significantly higher than the largest frequency of a temporally dependent voltage U (t) able to be measured. Furthermore, the changeover currents I developing on the oscillating measuring electrode 2 are evaluated spectrally, in order to determine the basic distance $d_0$ between the measuring electrode 2 and measuring object (line 1). After this calibration, the changeover current I is used during the measurement operation to back calculate to the unknown potential U.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A method for the contactless determination of an electrical potential of an object, comprising:
    providing a mechanically oscillating electrode, spatially distanced from the object;
    triggering the electrode to oscillate mechanically;
    determining a temporal change in an electrical charge state of the electrode;
    determining amplitudes of at least two frequency components in the temporal change of the electrical charge state by
        determining a first amplitude at a first frequency;
        determining a second amplitude at a second frequency, as a whole number multiple of the first frequency; and
        determining an idling distance of the electrode from the object based on a ratio of the first amplitude to the second amplitude;
    determining, based on the first and second amplitudes, at least one parameter included in a value of an electrical capacitance of an arrangement formed by the electrode and the object;
    determining the electrical capacitance of the arrangement formed by the electrode and the object based on the parameter; and
    determining the electrical potential from the temporal change in the electrical charge state and the electrical capacitance of the arrangement.

2. The method as claimed in claim 1, wherein the at least one parameter is determined by at least one of a mathematical association and a calibration curve.

3. The method as claimed in claim 2, wherein the electrode is mechanically oscillated with an oscillation direction parallel to an electrical field line caused by the electrical potential of the object.

4. The method as claimed in claim 3, wherein the temporal change in the electrical charge state of the electrode is determined by measuring a changeover current.

5. The method as claimed in claim 4, wherein the electrical potential is determined based on at least one of a mathematical association and a calibration curve from the temporal change in the electrical charge state.

6. The method as claimed in claim 5,
    wherein the electrical potential is temporally changeable at an electrical oscillation frequency, and
    wherein the electrode is mechanically oscillated at a mechanical oscillation frequency greater than the electrical oscillation frequency.

7. An apparatus for the contactless determination of an electrical potential of an object, comprising:
    a mechanically oscillating electrode disposed at a distance from the object;
    a measuring apparatus configured to determine a temporal change in an electrical charge state of the electrode; and
    an evaluation apparatus, configured to determine
        amplitudes from at least two frequency components, including a first amplitude at a first frequency and a second amplitude at a second frequency, in the temporal change in the electric charge state, the second frequency being a whole number multiple of the first frequency,
        an idling distance of the electrode from the object based on a ratio of the first amplitude to the second amplitude,
        at least one parameter, included in a value of an electrical capacitance of an arrangement formed by the electrode and the object, based on the first and second amplitudes,
        the electrical capacitance of the arrangement formed by the electrode and the object based on the parameter, and
        the electrical potential from the temporal change in the electrical charge state and the electrical capacitance.

8. The apparatus as claimed in claim 7,
    wherein the measuring apparatus is a current measuring device, and
    wherein the electrode is a plate, electrically connected to the current measuring device, that is electrically conductive and has an oscillation direction substantially normal to the plate.

* * * * *